United States Patent [19]

Gianni

[11] 4,192,565
[45] Mar. 11, 1980

[54] MULTI-LEVEL SOCKET FOR AN INTEGRATED CIRCUIT

[76] Inventor: Richard Gianni, 216 Livorna Heights, Alamo, Calif. 94507

[21] Appl. No.: 854,540

[22] Filed: Nov. 25, 1977

Related U.S. Application Data

[63] Continuation-in-part of Ser. No. 736,577, Oct. 28, 1976, Pat. No. 4,080,026.

[51] Int. Cl.² ............................................. H01R 13/12
[52] U.S. Cl. ............................. 339/17 CF; 339/258 P
[58] Field of Search ........... 339/17 CF, 258 R, 258 P, 339/258 RR, 32 R, 33

[56] References Cited

U.S. PATENT DOCUMENTS

| | | | |
|---|---|---|---|
| 3,431,545 | 3/1969 | Kirby | 339/258 P |
| 3,824,557 | 7/1974 | Mallon | 339/17 CF |
| 3,955,869 | 5/1976 | Licht | 339/32 R |
| 4,018,494 | 4/1977 | Scheingold et al. | 339/17 CF |
| 4,045,105 | 8/1977 | Lee et al. | 339/17 CF |

*Primary Examiner*—Howard N. Goldberg
*Attorney, Agent, or Firm*—Phillips, Moore, Weissenberger, Lempio & Majestic

[57] ABSTRACT

An integrated circuit socket adapted for use with circuits such as dual-in-line packages (DIPs) provides multilevel mounting for such integrated circuits. The socket body is formed to receive the first integrated circuit package while the second integrated circuit package is disposed above the first. Metallic contact members are disposed in holes arranged to coincide with the electrical leads subtending from each circuit. Each contact member is formed with means to receive the coincident electrical leads from the first and second circuits. Each contact member is formed to engage the socket preventing inadvertent removal of the contact member. The contact members are sufficiently long to extend through the socket and an associated printed circuit board to which they may be readily fixed by conventional means. In the one embodiment the socket is unitary and is formed with longitudinal protruding spacer members to separate it from the circuit board. In a second embodiment the socket is modular. Still a third embodiment provides an adjacent contact member allowing selective separate engagement of a lead from one of the two electronic packages.

4 Claims, 12 Drawing Figures

U.S. Patent  Mar. 11, 1980  Sheet 1 of 3  4,192,565
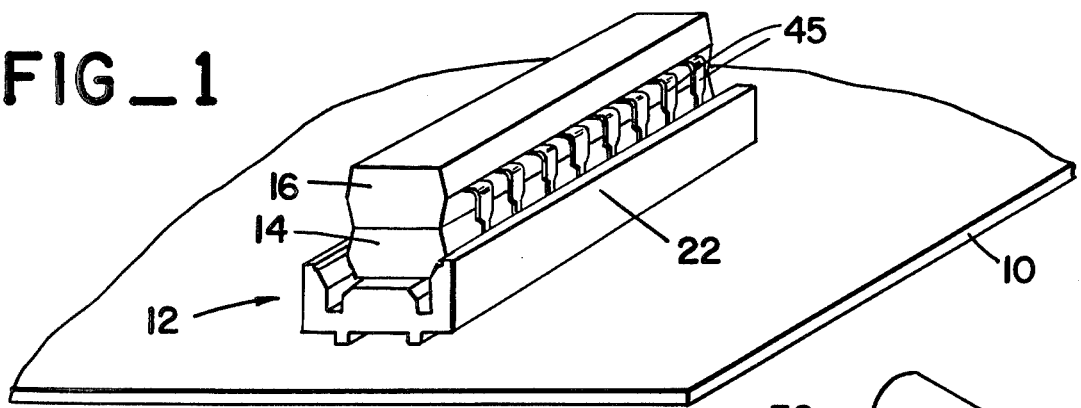
FIG_1
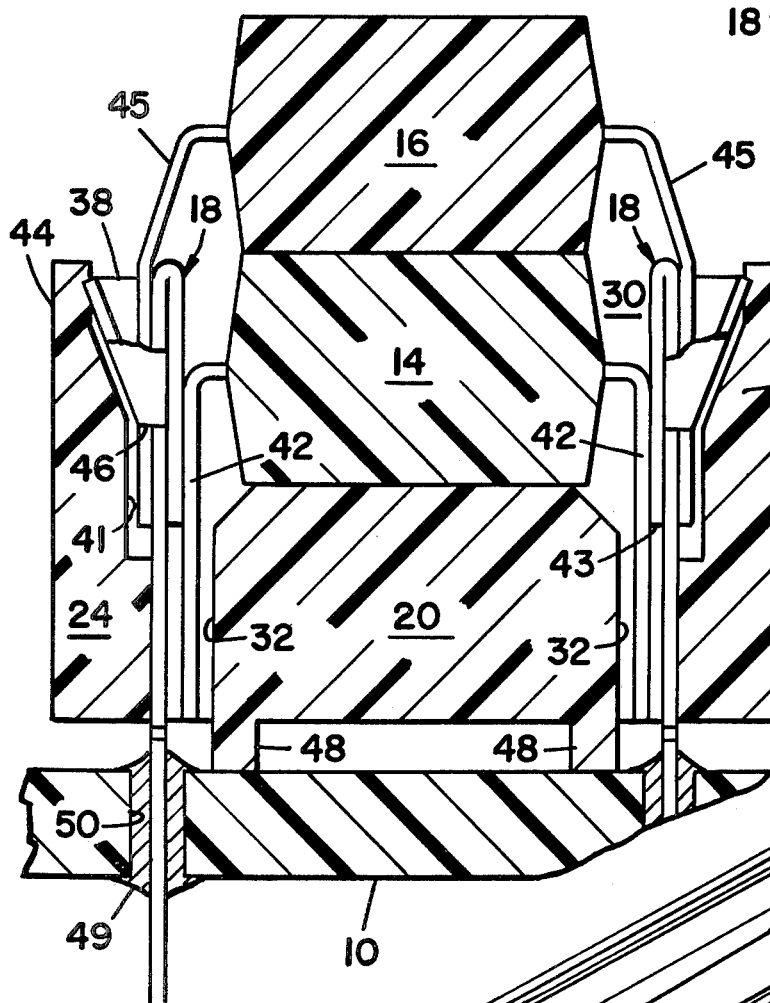
FIG_2
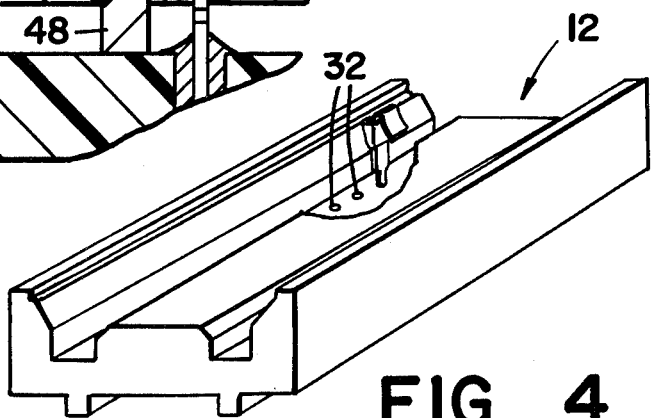
FIG_3
FIG_4

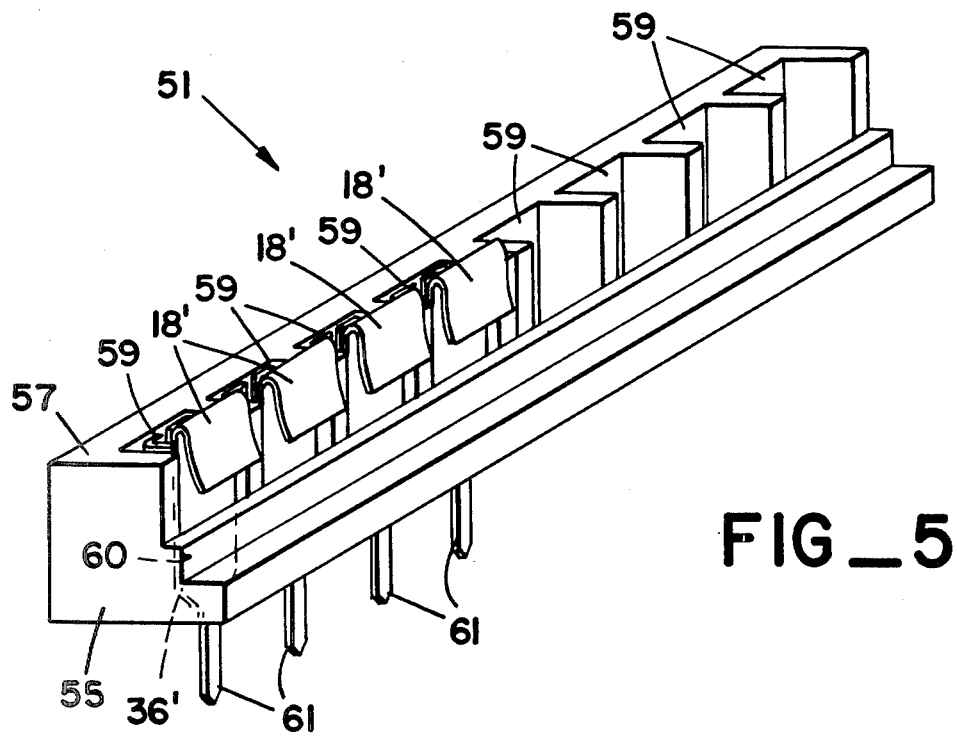
FIG_5
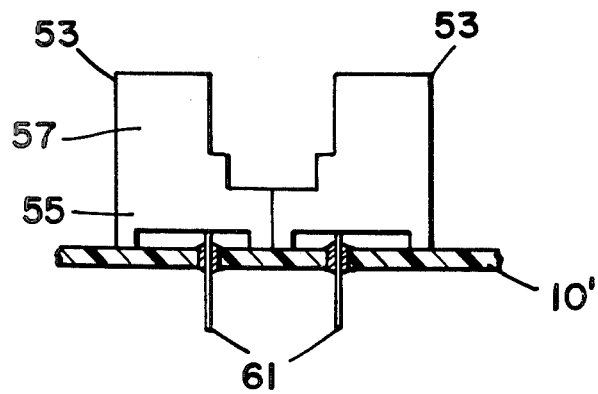
FIG_6
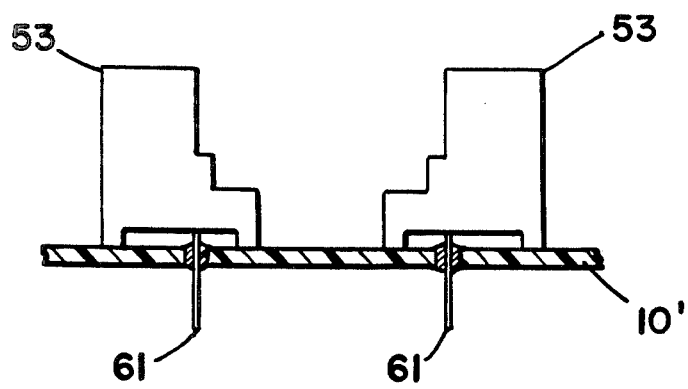
FIG_7

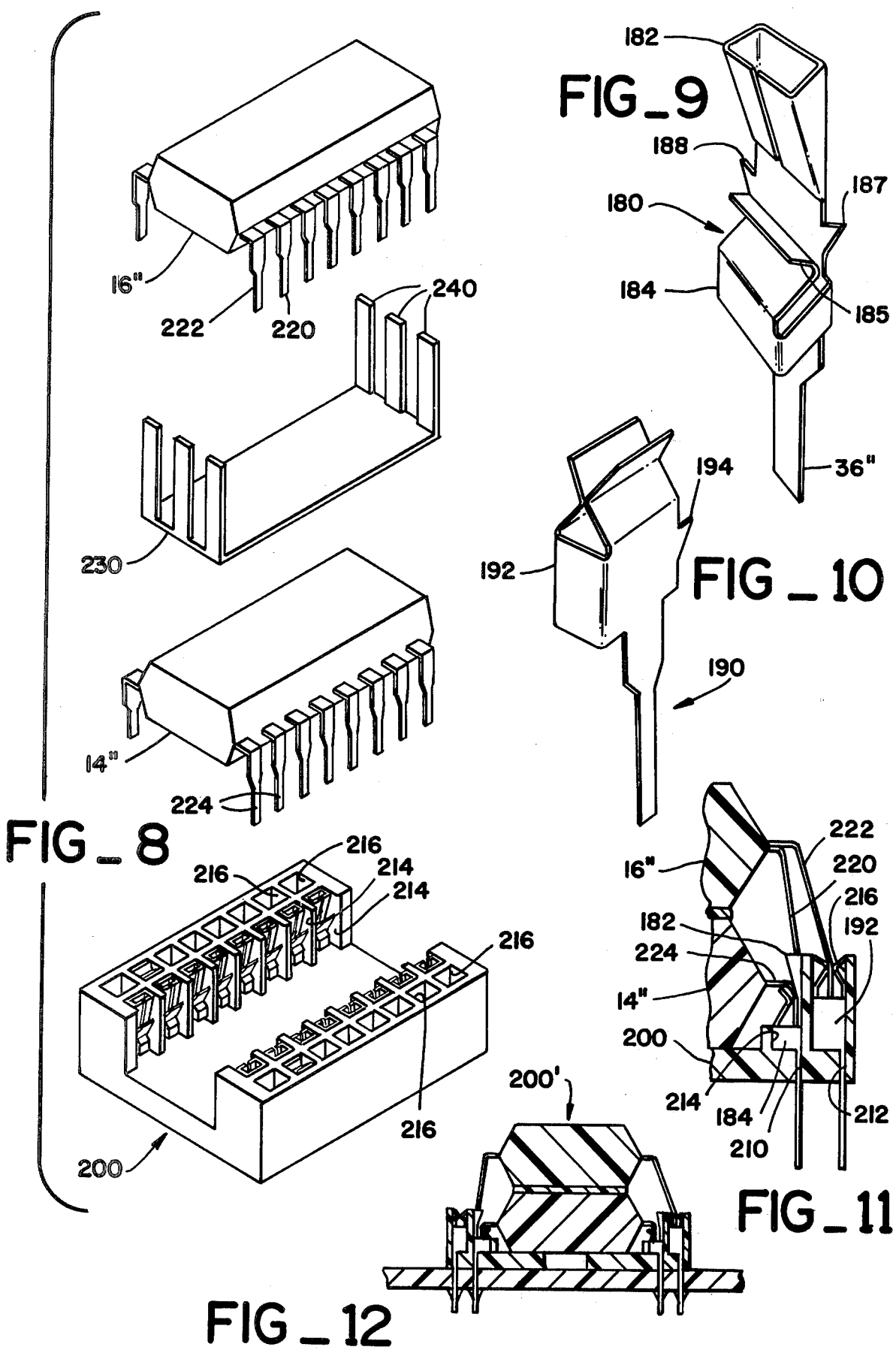

MULTI-LEVEL SOCKET FOR AN INTEGRATED CIRCUIT

CROSS REFERENCE TO RELATED APPLICATION

This is a continuation-in-part of application Ser. No. 736,577, filed Oct. 28, 1976, and now U.S. Pat. No. 4,080,026, issued Mar. 21, 1978.

BACKGROUND OF THE INVENTION

This invention relates to the mounting of integrated circuits, such as dual-in-line packages commonly called DIPS or any other device including photo-optic/electric devices. Such circuits are found in a large variety of electronic applications. For convenience sake this invention is disclosed in terms of the DIP but should be considered applicable to all electrical or photo/optic type devices. For example, each individual DIP or dual-in-line package may perform a particular electronic function. In many cases this function is repetitive and requires a plurality of identical dual-in-line packages, which may be mounted on a single circuit board in an electronic device comprised of a plurality of relatively widely separated circuit boards. Mounting of electronic circuits such as dual-in-line packages is normally accomplished through the use of a socket, however, considerable space may be wasted by mounting only one layer of packages on the relatively widely separated circuit boards. It may not be appropriate to decrease the distance between adjacent circuit boards as a portion of this space is necessary to allow cooling air to circulate in the device. It would be advantageous, however, to be able to mount at least two layers of dual-in-line package type integrated circuits or the like in the same area now required to mount the single dual-in-line package type integrated circuit or the like. Since dual-in-line package type integrated circuits come in several standard sizes, that is the length, width and contact leads are generally standardized, it is appropriate to design a standardized socket which permits stacking of the integrated circuits. It is particularly advantageous to provide for at least one unique connection for corresponding leads of each pair of dual-in-line packages or the like while maintaining the paired coincident connection of all remaining leads or alternatively all remaining leads. The result of stacking of the circuits is a great saving of the space requirements for the device.

SUMMARY OF THE INVENTION

Accordingly this invention provides a socket to be affixed to a conventional printed circuit board which permits stacking two integrated circuits or the like, one atop the other. The socket includes contact pins that grip and retain the electronic package and which also extend through a conventional circuit board for connection by means well known in the art such as soldering or wire wrapping.

It is an object of this invention to provide an integrated circuit socket which allows for stacking of integrated circuits.

It is further an object of this invention to provide the aforedescribed socket which includes metal contact means for making electrical contact with the subtending leads from mounted integrated circuits.

It is also an object of this invention to provide a socket wherein the metal contact means include at least one pair of adjacent but separate metal contact members each for receiving at least one of a corresponding pair of leads from a pair of stacked integrated circuits.

It is also an object of this invention to provide an integrated circuit socket which is economical to manufacture.

It is still another object of this invention to provide an integrated circuit socket wherein the metallic contact means may be connected to a conventional printed circuit type board.

It is still another object of this invention to provide an integrated circuit socket wherein the metal contact means includes means to clean the subtending leads of a mounted integrated circuit upon mounting the circuit in the socket.

Broadly stated, the invention is a metal contact member for use with an electrical circuit socket adapted for mounting a plurality of integrated electrical circuits. The metal contact member comprises an elongated member having an extended base portion at one end to be received in the electrical circuit socket. Integrally formed with the metal contact member are first and second pockets each for frictionally retaining a lead of an integrated electrical circuit.

These and other objects of the invention will become apparent from a study of the accompanying drawings and the following specification.

BRIEF DESCRIPTION OF THE DRAWINGS

FIG. 1 is a perspective view of an integrated circuit socket which is the subject of this invention shown in relation to a circuit board, the socket having two dual-in-line package type integrated circuits mounted therein.

FIG. 2 is a sectional view of the integrated circuit socket and integrated circuits shown in perspective in FIG. 1.

FIG. 3 is a detailed view of a metal contact member which may be utilized in the integrated circuit socket.

FIG. 4 is a view of the integrated circuit socket in perspective with one metal contact member installed therein.

FIG. 5 is a perspective view of an alternate embodiment of the integrated circuit socket formed of two modules.

FIG. 6 is an end view of the modular integrated circuit socket shown in FIG. 5 affixed to a circuit board for use with one size of integrated circuit.

FIG. 7 is an end view of the modular integrated circuit socket shown in FIG. 5 affixed to a circuit board for use with a second size of integrated circuit.

FIG. 8 is an exploded view of a third embodiment of an integrated circuit socket.

FIG. 9 is an alternative metal contact pin for use in either embodiment of the socket base.

FIG. 10 is a metal contact pin adapted for use with the third embodiment.

FIG. 11 is a sectional view of a portion of the third embodiment.

FIG. 12 is a cross section of a modularized form of the third embodiment.

DETAILED DESCRIPTION OF THE PREFERRED EMBODIMENT

Referring now to FIG. 1, a portion of a circuit board 10 utilized in electronic circuitry is shown with a circuit socket 12 of a type envisioned by this invention mounted thereon. A first electronic package 14 which may be a dual-in-line package and a second electronic circuit 16 which may also be in the form of a dual-in-line package are shown mounted in socket 12. Other circuit packages such as large scale integration (LSI), connectors, photo-optic/electrical devices, and other electro-mechanical devices may also be mounted in socket 12 with appropriate modification to meet the specification of the circuit. For example, dual-in-line packages in the form of electronic circuit 14 conform to rather rigid specifications, particularly in regard to the plurality of leads or subtending contact pins. Such dual-in-line packages may be made for example in 8 pin, 14 pin, 16 pin, and 18 pin or more configurations. Accordingly, it is envisioned that socket 12 would be made in conformance with the standards of the industry to accept the various circuit packages. For dual-in-line packages, the width dimension of at least the 8 pin, the 14 pin and the 16 pin, that is the dimension between the rows of subtending pins; is constant while other dual-in-line packages with more pins may be wider. Since the dimension between each adjacent pin in all dual-in-line packages is the same, it is possible to make socket 12 for DIPs in as few as two sizes, one to take the 8,14,16 and 18 pin dual-in-line packages. Alternatively, since the inter-pin spacing in each row is constant, the socket can be modularized to two or more parts with the parts being positioned on the circuit board in accord with the particular dual-in-line package.

Hereinafter in the specification and in the claims the terms electrical circuit and integrated circuit are used interchangeably and include dual-in-line packages, large scale integration, connectors, photo-optic/electric devices and other electro/mechanical devices.

A preferred socket 12 is of the same general configuration with width between sides varying only. A contact pin 18, which is shown in FIG. 3, can be used in both configurations. Referring now to FIG. 2, the socket body, which is formed of a nonconductive material, has an elongated base portion 20. Upstanding from one side and unitarily formed with base portion 20 are parallel edge portions 22 and 24 which form a cavity 30 having a U shaped cross section in which the first integrated circuit 14 may be disposed. The base portion 20 defines a plurality of holes 32 which extend through the base portion from the interior of the cavity. The holes are adjacent edges 22 and 24 in two rows, each parallel with the longitudinal or major axis of socket 12 and may be separated one hole from the next adjacent hole by a predetermined distance substantially in conformance with the standards of the industry. In the preferred embodiment the separation of the rows of holes may again conform substantially to the standards for the particular device to be mounted.

Disposed in each hole 32 is a metallic contact member hereinafter referred to as metallic contact pin 18 and which is generally of the configuration shown in FIG. 3. The configuration shown in FIG. 3 is exemplary of various configurations and is described to show certain features necessary for proper mounting of integrated circuits such as envisioned in this invention. Initially the contact pin must make good electrical contact with the integrated circuit. Secondly, the metallic contact pin should be formed with a retentive feature in order to retain the electrical circuit or dual-in-line package in proximity with the socket. Finally, the metallic contact pin should be readily solderable. Metallic contact pin 18 accomplishes these three functions through the following features. The pin is integrally formed of a metal in the group which is easily solderable such as brass, bronze, silver, gold, a tin compound or the like. The pin 18 is comprised of an elongated leg portion 36 having a generally barbed shaped pocket 38 integrally formed at one end and on one side thereof. A folded over end is formed at the end proximate the barbed pocket. The contact pin 18 when inserted in a hole 32 is formed so that the barbed shaped pocket 38 engages the specially configured side portion 22 or 24 as the case may be. This will become more apparent during the succeeding discussion. Similarly, folded over end 40 resiliently extends outwardly into cavity 30 so that when the first electrical circuit such as integrated circuit 14 which may be a dual-in-line package or the like is disposed in cavity 30 the subtending contact lead 42 will contact the extreme edge 43 of folded over end 40. The edge 43 is made sufficiently sharp so that as the contact lead 42 depresses the resilient folded over end 40 adjacent the leg portion 36 of the contact pin, the edge 43 will scrape dirt and corrosion from the contact lead 42 to make a metal to metal contact therewith and also serve as means to retain the circuit in the cavity 30 adjacent base portion 20.

As previously mentioned, the barbed shaped pocket 38 contacts either side portion 22 or side portion 24. Side portion 22 and side portion 24 are identical in construction and differ only in that one is the reverse of the other, accordingly side portion 24 will be described. Side portion 24 has a vertical exterior surface 44 and an interior surface 41 which extends upwardly and outwardly from the base portion 20 to a point proximate the top of the socket where the surface extends vertically upwardly. With the first integrated circuit 14 positioned in cavity 30 the downwardly extending leads 42 contact the folded over ends 40 and, in addition to urging the folded over ends 40 toward leg portion 36, the contact leads 42 urge the two opposed contact pins 18 shown in FIG. 2 outwardly so that the barbed shaped pocket 38 makes harder contact with the upper portion of side portion 24 in a manner to better retain the contact pin 18 therein. Thus, as can be seen in FIG. 2, two contact pins 18 are disposed in opposite holes 32 in socket 12 with a first integrated circuit 14 disposed therein. The contact pins 18 are urged outwardly against the socket so that the barbed shaped pockets 38 engage the side portions thereof. The second integrated circuit 16 which need not be of the same configuration as integrated circuit 14, is disposed above the first integrated circuit with the subtending leads 45 of the second integrated circuit extending downwardly through the barbed shaped pocket 38. The barbed shaped pocket 38 has an edge 46 for scraping clean the contact lead 45 of the second integrated circuit or dual-in-line package 16. This edge 46 also serves as means to retain the contact lead 45 in the socket in the manner of edge 43.

An alternative metallic contact member 180 is shown in FIG. 9. Although the metallic contact pin 180 shown in FIG. 9 is particularly adaptable to the the non-conductive socket shown in FIG. 8 (to be described), the pin may be used in a modified form of socket 20. In particular the metallic contact pin 180 has upper retention means such as a barb-shaped pocket 182 formed at the top in the manner of the barb-shaped pocket 38 of the described metallic contact pin 18. Disposed below barb-shaped pocket 182 is a second retention means such as second pocket 184 having a folded over resilient top 185. The metallic contact pin 180 also includes means for retaining the pin in an appropriate hole formed in socket 20. Such means may be barb-shaped projections 187 and 188 integrally formed on the sides of the metal contact pin. Referring to FIG. 11 for a cross section view of an alternative socket 200 in which metallic contact pin 180 may also be used, it can be seen that the retention means, that is barb-shaped pocket 182 and pocket 184, are each adapted to receive subtending leads of vertically stacked integrated circuit 16" and 14". The metallic contact pin 180 has a corresponding extension 36" which may extend through the corresponding socket for fixture by soldering or other appropriate means to the appropriate circuit board. It will become apparent in the ensuing discussion that the pin 180 is particularly adapted to the socket 200 shown in FIG. 8 and to be described. It should be understood that various retention means for retaining subtending leads may be substituted for barb-shaped pocket 182 or second pocket 184. Such means may be of the form shown in FIG. 10 or in FIG. 3.

Referring again to FIG. 2, socket 20 is adapted to receive the first integrated circuit 14 with the subtending leads 42 interior of the contact pins 18. The second integrated circuit 16 is disposed on top of the first integrated circuit with the contact leads 45 of the second integrated circuit extending downwardly through the barbed shaped pockets 38. It should be understood that FIG. 2 is representative of a cross section only and there may be a number of contact pins 18 equal to the number of subtending contact leads of the mounted integrated circuits.

It is to be understood that socket 12 may be formed with protrusions 48 extending downwardly from the side of base 20 opposite edges 22 and 24 to separate base portion 20 from the circuit board 10. These protrusions 48 are purposely formed on the base portion to allow for cooling air to circulate beneath base protion 20 and further to separate the integrated circuit 14 and integrated circuit 16 sufficiently from the circuit board so that if contact pins 18 must be soldered or desoldered in circuit board 10 with the circuits in place the heat is substantially dissipated before reaching cavity 30. Of course, the contact pins 18 would normally be soldered before mounting of the integrated circuits in the cavity. If the pins 18 are wire-wrapped, heat disipation during fixture is not a problem.

Referring now specifically to FIG. 2, it can be seen that contact pin 18, which is sufficiently long to extend through circuit board 10, is formed with a surface so that the soldered joint 49 formed adjacent to circuit board 10 may extend substantially through the hole 50 of the circuit board 10.

In operation, it is envisioned that a circuit board 10, which is to be utilized in an electronic circuit, has properly printed on one or more sides thereof a circuit in accord with the design of the desired circuit. This printing, which does not appear in the drawings would confrom to a predetermined pattern. The contact pins 18 extending through the plurality of holes 50 in the circuit board 10 connect by appropriate means such as solder or the like at proper points with the appropriate printed circuit. Thus, a socket 12 with a plurality of contact pins 18 disposed in the aligned holes 32 and properly positioned on board 10 would provide for a "plug in" point for two integrated 10 would provide for a "plug in" point for two integrated circuits which could be of the dual-in-line package type. Specifically, socket 12 would be disposed on circuit board 10 with the pins 18 extending through the appropriate holes 50, then utilizing appropriate teaching well-known in the art, the pins 18 would be fixed to holes 50, either as a unit or individually. Then assembly of the circuit board could take place by disposing initially the first integrated circuit 14 into cavity 30. This, as mentioned above, will tend to urge the pins 18 outwardly so that the barbed shaped pockets 38 will contact the side portions 22 and 24 of the socket to better retain the socket and the circuit adjacent circuit board 10. It should be apparent to those skilled in the art that leg portion 36 of pin 18 may be relatively rigid while folded over end 43 may be resilient. Edge 43 of each pin is concurrently scraping contact 42 to make adequate contact with contact 42. If it is desired to dispose a second integrated circuit or dual-in-line package type, the second circuit can be immediately disposed above the first circuit 14 so that leads 45 extend downwardly through barbed shaped pocket 38. It can be readily seen by those skilled in the art that, in those installations which require a large number of identical circuits, the circuits can be mounted in pairs while using this invention. This, of course, reduces space in the finished electronic package and secondly reduces cost in that only half of the number of leads must be fixed to the printed circuit.

A modularized socket is shown in FIGS. 5, 6, and 7 which conforms to the objects of the preferred embodiment wherein two integrated electrical circuits may be mounted one above the other. The modularized socket 51 shown in FIG. 5 is comprised of at least two modules each of which is an elongated L-shaped body 53 having a unitarily formed stepped base 55 and an upstanding side portion 57. In the embodiment shown in FIG. 5, individual pin cavities 59 are molded into the L-shaped body 53, with each individual pin cavity 59 formed to receive a metal contact pin 18', or alternatively, metal contact pin 180, of the type described in the first embodiment. Each L-shaped body is further formed with a plurality of holes 60, each communicating with an individual pin cavity 59 and extending through the base portion 55. These holes 60 are each adapted to receive leg 36' of metal contact pin 18', which itself may have a narrowed lower portion 61.

In use, a pair of modules may be arranged in parallel-facing arrangement to form the modularized socket which may be affixed to a circuit board 10' as shown in FIG. 6 or FIG. 7. Electronic packages (not shown) such as dual-in-line packages may be disposed in the socket 51 in the same manner as in the preferred embodiment. The advantage of the modularized structure is that the same modules may be used for both the relatively narrow electronic circuits and for the relatively wide electronic circuits. These two mounting arrangements are shown in FIG. 6 and 7.

A third embodiment, which is illustrated in FIG. 8 in an exploded view with two integrated electrical circuits 14" and 16" which may be dual-in-line packages, provides for a separate connection of at least one of the subtending leads of one of the integrated electrical circuits. The integrated circuit socket 200 shown in FIG. 8 may be of the single configuration corresponding to the first embodiment or alternatively, and shown in FIG. 12 in the modularized form 200'. Each socket 200 is formed with parallel rows of holes 214 adjacent the open center portion of the socket as best seen in FIG. 8 and a second row of holes 216 formed outwardly of the row of holes 214. Particularly adapted for this embodiment is the metallic contact pin 180 shown in FIG. 9 and adapted to be received one of the holes 214 and a second metallic contact pin 190 which is particularly adaptable to be received in the holes 216. Referring to FIG. 11 it can be seen that these two metallic contact pins may be disposed in a side by side relationship. This particular arrangement provides for separate connection of at least one subtending lead from the upper of the integrated electrical circuits. Referring to FIG. 11 in conjunction with FIG. 8, the lower of the two integrated electrical circuits 14" has subtending therefrom a plurality of leads 224. Each lead 224 may be frictionally and resiliently retained in pocket 184 of metallic contact pin 180. As previously mentioned, the pocket 184 includes a resilient portion 185 which holds the individual subtending lead 224 relative the pocket while the pin is retained in the socket 200 by the barbs 187 and 188 previously described. The second pocket 182 disposed above and on the same side of the metallic contact pin 180 is adapted to receive the subtending lead 220 from an integrated electrical circuit 16" as indicated in FIG. 11. It should be noted that the subtending lead 222 shown in FIG. 8 is concurrently held in the metallic contact pin 190 disposed in the outer line of pockets 216. The metallic contact pin 190, which includes a resiliently biased pocket 192 to resiliently retain a single lead from an integrated electrical circuit, is insulated from the first metallic contact pin 180 by the structure of the socket. Thus corresponding leads from the two circuits 16" and 14" are connected to separate portions of the total electronic circuit board. The second metallic contact pin 190 as indicated in FIG. 10 includes a barb-like projection 194 to contact the side of hole 216 to retain the contact member in the hole.

An additional feature of this invention is the heat sink 230 best illustrated in FIG. 8. This heat sink has been found advantageous to radiate heat at least from the lower of the two integrated electrical circuits through the plurality of vertical extensions 240. The heat sink 230 should not be considered as a limiting portion of the invention.

In operation the third embodiment is used essentially in the same manner as the previous embodiments. However, as illustrated in FIG. 11 and described above, the upper integrated electrical circuit 16" may have at least one subtending lead 222 affixed to a separate metallic contact pin insulated from the remaining metallic contact pins, each of which receive coincident pairs of leads from the two circuits. Furthermore, the embodiment described in FIGS. 8 through 11 may be configured so that each socket 200 will be fitted with only a single metallic contact pin 190 in the position corresponding to a desired subtending lead 222 from the upper circuit. This particular arrangement allows for economy in construction in that a minimum number of metallic contact pins 190 are necessary for a particular configuration.

It should be understood by those skilled in the art that the metallic contact pins 18, 180 and 190 depend upon friction in one form or another to retain the subtending leads from the integrated electrical circuits. Furthermore, the frictional retention means in all of the metallic contact members can be made to abrade the subtending lead in a fashion to clean the leads as the circuits are inserted into the various socket members. This cleaning action is particularly advantageous to form a good metal-to-metal contact between the circuit leads and the metallic contact member.

Although this invention has been described in relation to dual-in-line package type integrated electrical circuits, it is to be understood that other types of devices could be similarly mounted utilizing the teaching herein. Therefore, it is to be understood by those skilled in the art that this invention is limited only by the extent of the claims apended hereto.

What is claimed is:
1. A multi-level socket for mounting a plurality of integrated electrical circuits, each circuit having a plurality of subtending leads arranged in one or more rows, the socket comprising:
   a non-conductive elongated body comprising a base portion, an edge portion unitarily formed with said base portion and upstanding from one side thereof, the body defining a plurality of holes extending through said base portion aligned along the major axis and adjacent the one edge thereof; and
   at least two elongated metal contact members each retainably positioned in one of said holes to extend therethrough, each metal contact member having a frictional retention means for retaining one of the subtending leads of a first integrated electrical circuit and one of the subtending leads of a second integrated electrical circuit, each metal contact member further having a contact portion distal of retention means;
   each metallic contact member comprising a metal contact pin and wherein said frictional retention means comprises first and second pockets integrally formed with and extending outwardly of one side of said metal contact pin, one pocket disposed above the other, and said metal contact pin including means for retaining said metal contact pin in one of the plurality of holes extending through the base portion of the non-conductive elongated body.

2. The multi-level socket of claim 1, wherein the non-conductive elongated body further defines a second plurality of holes extending through the edge portion thereof adjacent and parallel to the plurality of holes extending through the base portion;
   the socket further comprising at least one additional metal contact member retainable in one of the second of the plurality of holes to extend therethrough, the one additional metal contact member having third frictional retention means for frictionally retaining one of the subtending leads of a second integrated electrical circuit while the corresponding lead of the first integrated electrical circuit is retained in one of the two elongated metal contact members positioned in one of the first plurality of holes.

3. The multi-level socket of claim 2 wherein the one additional metal contact member comprises a second metal contact pin and wherein the third frictional retention means comprises a resiliently biased pocket integrally formed with the metal contact pin.

4. The multi-level socket of claim 3, wherein the non-conductive elongated body further comprises a second edge unitarily formed with said base portion and upstanding from said base portion at one side, parallel to and laterally spaced apart from the first edge portion; and
   further wherein the body defines a third plurality of holes extending through said base portion adjacent the second edge portion, said third plurality of holes laterally displaced from the first plurality of holes a predetermined distance from and parallel to the first plurality of holes; and
   further wherein the body defines a fourth plurality of holes extending through said base portion adjacent the second edge portion and parallel to the third plurality of holes.

* * * * *